US012316313B2

(12) United States Patent
Hashimoto

(10) Patent No.: US 12,316,313 B2
(45) Date of Patent: *May 27, 2025

(54) ELECTRONIC DEVICE

(71) Applicant: Innolux Corporation, Miaoli County (TW)

(72) Inventor: Kazuyuki Hashimoto, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/666,781

(22) Filed: May 16, 2024

(65) Prior Publication Data

US 2024/0305293 A1 Sep. 12, 2024

Related U.S. Application Data

(63) Continuation of application No. 17/887,505, filed on Aug. 14, 2022, now Pat. No. 12,021,518.

(60) Provisional application No. 63/283,303, filed on Nov. 26, 2021.

(51) Int. Cl.
*H03K 17/687* (2006.01)
*G09G 3/32* (2016.01)
*G09G 3/3275* (2016.01)

(52) U.S. Cl.
CPC ........... *H03K 17/6872* (2013.01); *G09G 3/32* (2013.01); *G09G 3/3275* (2013.01); *G09G 2310/0256* (2013.01)

(58) Field of Classification Search
CPC .... H03K 17/6872; G09G 3/32; G09G 3/3275; G09G 2310/0256; G09G 2300/0814; G09G 2300/0819; G09G 2320/045; H03F 1/0261; G05F 1/561
See application file for complete search history.

(56) References Cited

U.S. PATENT DOCUMENTS

| 6,587,001 | B1 | 7/2003 | Wyles et al. |
| 2015/0269886 | A1* | 9/2015 | Tan ........................ H04N 25/77 345/82 |
| 2017/0206839 | A1* | 7/2017 | Wu ....................... G09G 3/3233 |
| 2018/0151656 | A1* | 5/2018 | Choo ................. H10K 59/1213 |
| 2019/0332841 | A1* | 10/2019 | Zhou .................. G06V 40/1306 |

FOREIGN PATENT DOCUMENTS

| CN | 101079233 | 11/2007 |
| CN | 108154849 | 6/2018 |

OTHER PUBLICATIONS

"Office Action of China Counterpart Application", issued on Mar. 6, 2025, p. 1-p. 7.

* cited by examiner

*Primary Examiner* — Andrew Sasinowski
(74) *Attorney, Agent, or Firm* — JCIPRNET

(57) ABSTRACT

An electronic device is provided. The electronic device includes a first circuit, a second circuit, and an electronic component. The first circuit, the second circuit, and the electronic component are electrically connected to a node. The first circuit receives a first operation voltage, and the second circuit receives a second operation voltage. The electronic component receives a third operation voltage, and the third operation voltage is between the first operation voltage and the second operation voltage.

19 Claims, 7 Drawing Sheets

ELECTRONIC DEVICE

CROSS-REFERENCE TO RELATED APPLICATION

This application is a continuation application of and claims the priority benefit to U.S. application Ser. No. 17/887,505, filed on Aug. 14, 2022, which claims the priority benefit of U.S. provisional application Ser. No. 63/283,303, filed on Nov. 26, 2021. The entirety of each of the above-mentioned patent applications is hereby incorporated by reference herein and made a part of this specification.

BACKGROUND

Technical Field

The disclosure relates a device, particularly, the disclosure relates to an electronic device.

Description of Related Art

In general, a varactor antenna having a varactor consists of active-matrix pixel, which is voltage-biased by a voltage source circuit. The voltage source circuit is realized with a source follow amplifier, which keeps bias voltage with a source current (NMOS) or a sink current (PMOS) to compensate a leak current of the varactor, thus bidirectional biasing needs the complementary metal-oxide-semiconductor (CMOS) process for compensating the reverse current and forward current of varactor with the source current and the sink current by the circuits.

SUMMARY

The electronic device of the disclosure includes a voltage source circuit, a current source circuit and an electronic component. The voltage source circuit, the current source circuit and the electronic component are electrically connected to a node.

The electronic device of the disclosure includes a first circuit, a second circuit, and an electronic component. The first circuit, the second circuit, and the electronic component are electrically connected to a node. The first circuit receives a first operation voltage, and the second circuit receives a second operation voltage. The electronic component receives a third operation voltage, and the third operation voltage is between the first operation voltage and the second operation voltage.

Based on the above, according to the electronic device of the disclosure, the electronic device can realize a bidirectional biasing circuit including a voltage source circuit and a current source circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
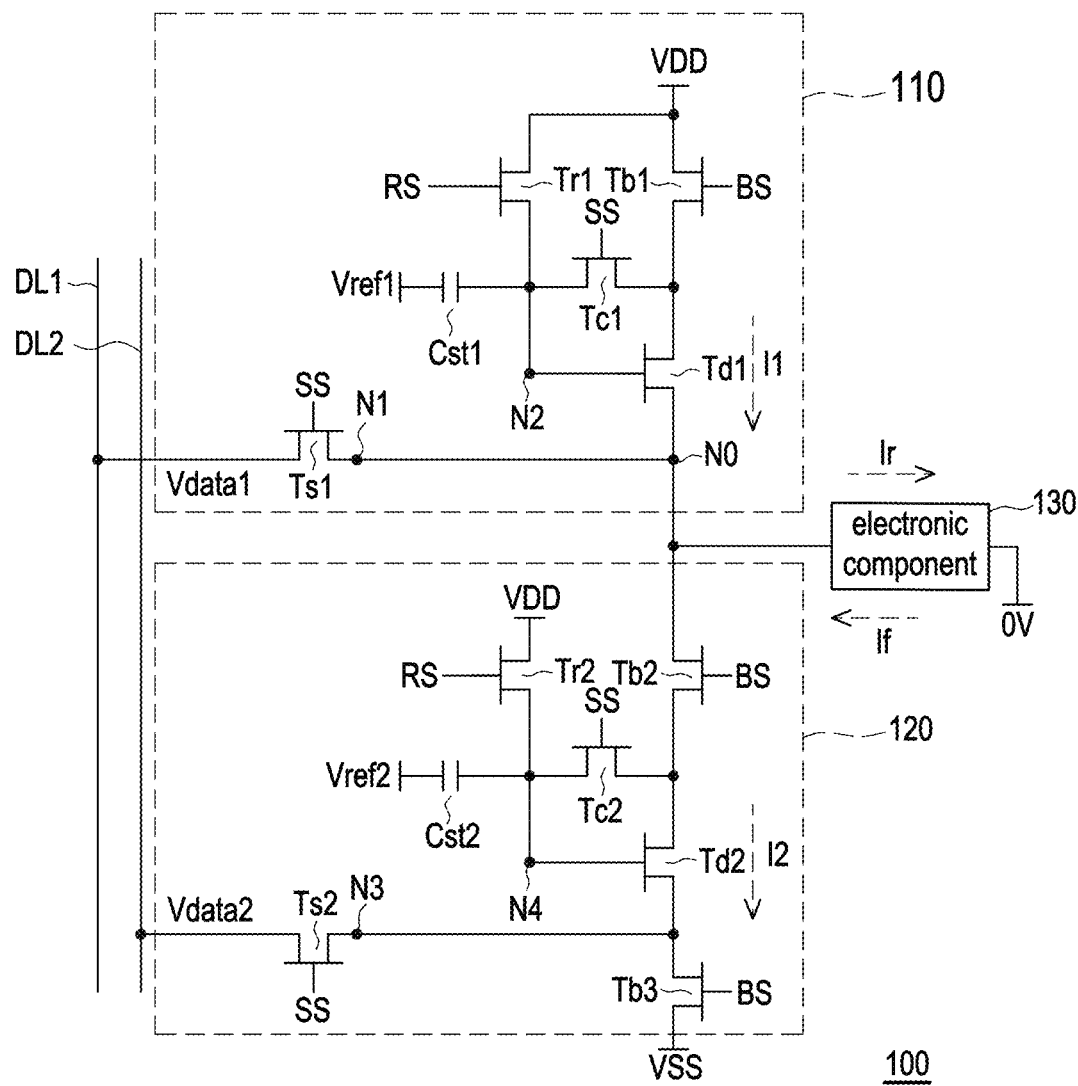
FIG. 1 is a schematic diagram of an electronic device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or electrically connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

The electronic device of the disclosure may include, for example, an antenna pixel circuit, and the electronic component may correspond to an antenna unit of one pixel of the antenna pixel. The electronic component of the disclosure may be a voltage-controlled device, and the voltage-controlled device may include, for example, a varactor, a resistor, an inductor or a capacitor. It should be noted that, the electronic device of the disclosure may be manufactured using a display panel process, and related transistors and electronic components are fabricated on a glass substrate.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

FIG. 1 is a schematic diagram of an electronic device according to an embodiment of the disclosure. Referring to FIG. 1, an electronic device 100 includes a voltage source circuit 110, a current source circuit 120 and an electronic component 130. The voltage source circuit 110, the current source circuit 120 and the electronic component 130 are electrically connected to a node N0. The voltage source circuit 110 is further electrically connected to a data line DL1. The current source circuit 120 is further electrically connected to a data line DL2. The electronic component 130 is electrically connected between the node N0 and a ground voltage (0V). In the embodiment of the disclosure, the voltage source circuit 110 and the current source circuit 120 form a bidirectional biasing circuit, and the voltage source circuit 110 and the current source circuit 120 are configured to enable forward and reverse bias for the electronic component 130. In the embodiment of the disclosure, the voltage source circuit 110, the current source circuit 120 and the electronic component 130 may be a pixel unit of an array in a panel, and other pixel unit of the array may also have same circuit as the electronic device 100.

In the embodiment of the disclosure, the voltage source circuit 110 includes a drive transistor Td1, a scan transistor Ts1, a compensation transistor Tc1, a bias transistor Tb1, a reset transistor Tr1 and a storage capacitor Cst1. A first terminal of the scan transistor Ts1 is electrically connected to the data line DL1. A second terminal of the scan transistor Ts1 is electrically connected to a node N1. A control terminal of the scan transistor Ts1 receives a scan signal SS. A first terminal of the bias transistor Tb1 is electrically connected to a first operation voltage VDD. A control terminal of the bias transistor Tb1 receives a bias signal BS. A first terminal of the drive transistor Td1 is electrically connected to a second terminal of the bias transistor Tb1. A second terminal of the drive transistor Td1 is electrically connected to the second terminal of the scan transistor Ts1 through the node N1, and the second terminal of the drive transistor Td1 is further electrically connected to the electronic component 130 through the node N0. The node N1 is electrically connected to the node N0. A control terminal of the drive transistor Td1 is electrically connected to a node N2. A first terminal of the compensation transistor Tc1 is electrically connected to the control terminal of the drive transistor Td1 through the node N2. A second terminal of the compensation transistor Tc1 is electrically connected to the first terminal of the drive transistor Td1. A control terminal of the compensation transistor Tc1 receives the scan signal SS. A first terminal of the reset transistor Tr1 is electrically connected to the first operation voltage VDD. A second terminal of the reset transistor Tr1 is electrically connected to the first terminal of the compensation transistor Tc1 and the control terminal of the drive transistor Td1 through the node N2. A control terminal of the reset transistor Tr1 receives a reset signal RS. A first terminal of the storage capacitor Cst1 is electrically connected to the control terminal of the drive transistor Td1 through the node N2. A second terminal of the storage capacitor Cst1 is electrically connected to a reference voltage Vref1.

In the embodiment of the disclosure, the drive transistor Td1, the scan transistor Ts1, the compensation transistor Tc1, the bias transistor Tb1 and the reset transistor Tr1 are N-type transistors, such as a N-type metal oxide semiconductor (NMOS). In other embodiments of the disclosure, the drive transistor Td1 or other transistors may be a P-type transistor, such as a P-type metal oxide semiconductor (PMOS).

In the embodiment of the disclosure, the current source circuit 120 includes a drive transistor Td2, a scan transistor Ts2, a compensation transistor Tc2, a bias transistor Tb2, a bias transistor Tb3, a reset transistor Tr2 and a storage capacitor Cst2. A first terminal of the scan transistor Ts2 is electrically connected to the data line DL2. A second terminal of the scan transistor Ts2 is electrically connected to a node N3. A control terminal of the scan transistor Ts2 receives the scan signal SS. A first terminal of the bias transistor Tb2 is electrically connected to the electronic component 130 through the node N0. A control terminal of the bias transistor Tb2 receives the bias signal BS. A first terminal of the drive transistor Td2 is electrically connected to a second terminal of the bias transistor Tb2. A second terminal of the drive transistor Td2 is electrically connected to the second terminal of the scan transistor Ts2 through the node N3. A control terminal of the drive transistor Td2 is electrically connected to a node N4. A first terminal of the compensation transistor Tc2 is electrically connected to the control terminal of the drive transistor Td2 through the node N4. A second terminal of the compensation transistor Tc2 is electrically connected to the first terminal of the drive transistor Td2. A control terminal of the compensation transistor Tc2 receives the scan signal SS. A first terminal of the reset transistor Tr2 is electrically connected to the first operation voltage VDD. A second terminal of the reset transistor Tr2 is electrically connected to the first terminal of the compensation transistor Tc2 and the control terminal of the drive transistor Td2 through the node N4. A control terminal of the reset transistor Tr2 receives the reset signal RS. A first terminal of the storage capacitor Cst2 is electrically connected to the control terminal of the drive transistor Td2 through the node N4. A second terminal of the storage capacitor Cst2 is electrically connected to a reference voltage Vref2. A first terminal of the bias transistor Tb3 is electrically connected to the second terminal of the drive transistor Td2 and the second terminal of the scan transistor Ts2. A second terminal of the bias transistor Tb3 is electrically connected to a second operation voltage VSS. A control terminal of the bias transistor Tb3 is electrically connected to the bias signal BS. The first operation voltage VDD may be higher than the second operation voltage VSS, and the second operation voltage VSS may be lower than the ground voltage (0V). In the embodiment of the disclosure, the electronic component 130 may receive a third operation voltage through the node N0, and the third operation voltage is between the first operation voltage VDD and the second operation voltage VSS.

In the embodiment of the disclosure, the drive transistor Td2, the scan transistor Ts2, the compensation transistor Tc2, the bias transistor Tb2, the bias transistor Tb3 and the reset transistor Tr2 are N-type transistors. In other embodiments of the disclosure, the drive transistor Td2 or other transistors may be a P-type transistor.

In the embodiment of the disclosure, the voltage source circuit 110 and the current source circuit 120 receive same scan signal SS.

Figure 2A:
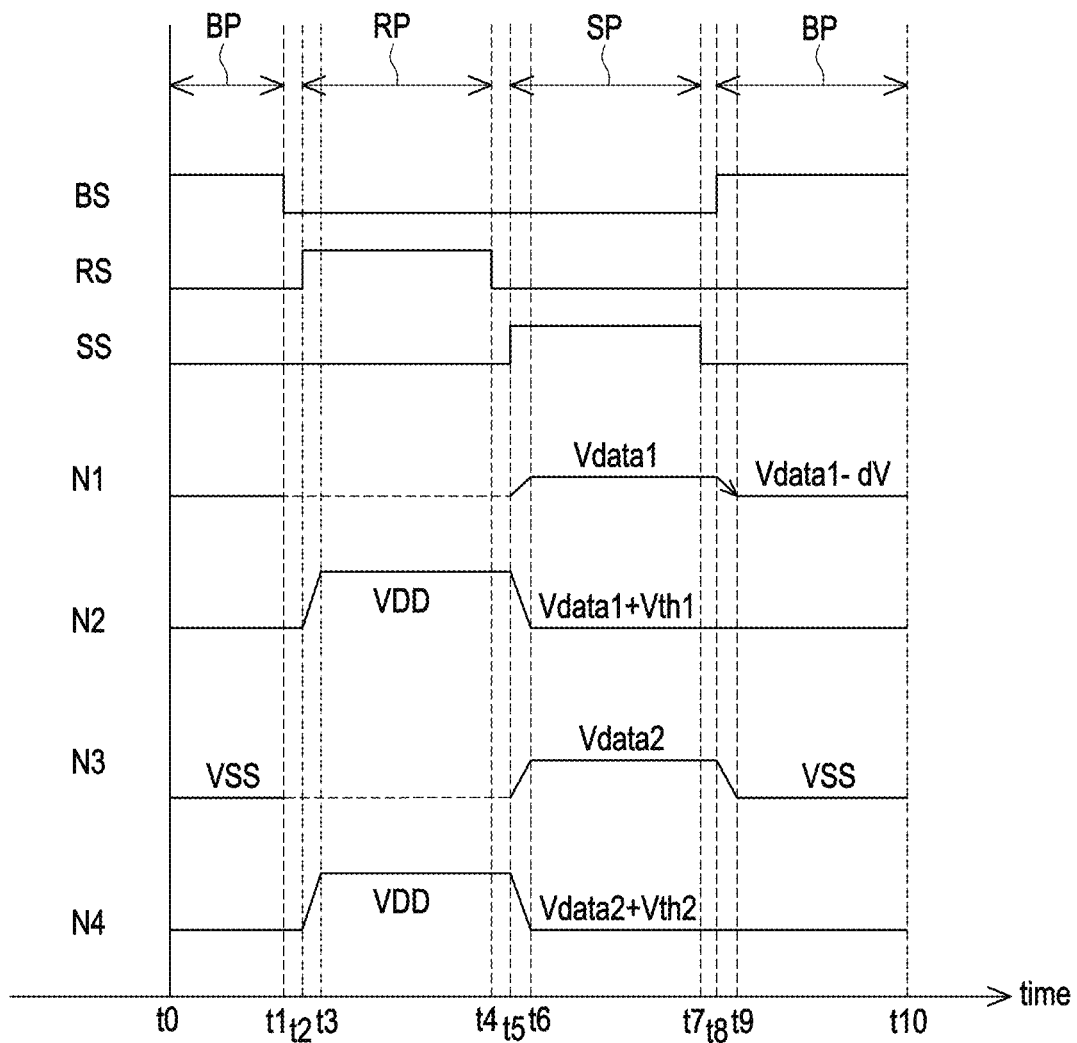
FIG. 2A is a timing diagram of related voltages and signals according to the embodiment of FIG. 1 of the disclosure.

FIG. 2A is a timing diagram of related voltages and signals according to the embodiment of FIG. 1 of the disclosure. Referring to FIG. 1 and FIG. 2A, the electronic device 100 may be operated at a bias period BP, a reset period RP and a scan period SP. In the embodiment of the disclosure, during the scan period SP from time t5 to time t7, the data line DL1 may provide a data signal with a data voltage Vdata1 to the voltage source circuit 110, and the data line DL2 may provide a data signal with a data voltage Vdata2 to the current source circuit 120. In the embodiment of the disclosure, an external control device may control the voltage source circuit 110 and the current source circuit 120 to operate the electronic component 130 by adjusting the data voltage Vdata1 and the data voltage Vdata2.

During the reset period RP from time t2 to time t4, the reset signal RS may be at a high voltage level, and the bias signal BS and the scan signal SS may be at a low voltage level. Thus, the reset transistor Tr1 is turned-on, and the node N2 is charged with the first operation voltage VDD. During the period from time t2 to time t3, the voltage of node N2 rises to the first operation voltage VDD, and the drive transistor Td1 is turned-on fully from time t3 to time t4. The reset transistor Tr2 is turned-on, and the node N4 is charged with the first operation voltage VDD. During the period from time t2 to time t3, the voltage of node N4 rises to the first operation voltage VDD, and the drive transistor Td2 is turned-on fully from time t3 to time t4. Other transistors of the voltage source circuit 110 and the current source circuit 120 are turned-off.

During the scan period SP from time t5 to time t7, the scan signal SS may be at the high voltage level, and the bias signal BS and the reset signal RS may be at the low voltage level. Thus, the scan transistor Ts1 and the compensation transistor Tc1 are turned-on, and the node N2 is discharged with the data voltage Vdata1 through the compensation transistor Tc1, the drive transistor Td1 and the scan transistor Ts1 respectively, and then the data voltage Vdata1 with threshold voltage compensation (threshold voltage of the drive transistor Td1) is stored in the node N2 by the diode connection of the drive transistor Td1. In this regard, during the period from time t5 to time t6, the voltage of the node N1 rises to the data voltage Vdata1, and the voltage of the node N2 may fall from the first operation voltage VDD to the voltage which equal to the data voltage Vdata1 plus the threshold voltage Vth1 of the drive transistor Td1. The scan transistor Ts2 and the compensation transistor Tc2 are turned-on, and the node N4 is discharged with the data voltage Vdata2 through the compensation transistor Tc2, the drive transistor Td2 and the scan transistor Ts2 respectively, and then the data voltage Vdata2 with threshold voltage compensation (threshold voltage of the drive transistor Td2) is stored in the node N4 by the diode connection of the drive transistor Td2. In this regard, during the period from time t5 to time t6, the voltage of the node N3 rises to the data voltage Vdata2, and the voltage of the node N4 may fall from the first operation voltage VDD to the voltage which is equal to the data voltage Vdata2 plus the threshold voltage Vth2 of the drive transistor Td2. Other transistors of the voltage source circuit 110 and the current source circuit 120 are turned-off.

During the bias period BP from time t8 to time t10 (the period from time t0 to time t1 same as the period from time t9 to time t10), the bias signal BS may be at the high voltage level, and the scan signal SS and the reset signal RS may be at the low voltage level. Thus, the bias transistor Tb1, the bias transistor Tb2 and the bias transistor Tb3 are turned-on. The voltage of node N2 may be maintained at the voltage which is equal to the data voltage Vdata1 plus the threshold voltage Vth1 of the drive transistor Td1. Thus, the voltage of the node N1 may be the voltage which is equal to the data voltage Vdata1 minus a delta voltage dV caused by gener-ating the source current I1. The voltage of node N4 may be maintained at the voltage which is equal to the data voltage Vdata2 plus the threshold voltage Vth2 of the drive transistor Td2. Due to the bias transistor Tb3 is turned-on, the voltage of the node N3 may fall to the second operation voltage VSS.

During the bias period BP from time t8 to time t10, if the electronic device 100 is operated in a reverse bias mode, a reverse current Ir (greater than 0) may flow through the electronic component 130 from the node N0 to the ground voltage (0V). The data voltage Vdata1 may be lower than the first operation voltage VDD, and the data voltage Vdata1 may be higher than or equal to the ground voltage (0V). The voltage source circuit 110 may be operated as a source follower amplifier to generate a source current I1 according to the data voltage Vdata1 provided by the DL1, so as to automatically keep a bias voltage at the node N0. The bias voltage is applied to the electronic component 130. The source current I1 flows from the voltage source circuit 110 to the node N0. The bias voltage may be higher than or equal to the ground voltage (0V). If the reverse current Ir is too small to be compensated by the source current I1, the current source circuit 120 may generate a sink current I2 according to the data voltage Vdata2. The sink current I2 flows from the node N0 to the current source circuit 120. The source current I1 is larger than the sink current I2. If the reverse current Ir is large enough, the sink current I2 may be zero with the drive transistor Td2 turned-off by the data voltage Vdata2. In the embodiment of the disclosure, when the source current I1 is equal to the sink current I2 plus the reverse current Ir, the bias voltage is stable. In other words, the reverse current Ir may equal to the source current I1 minus the sink current I2.

During the bias period BP from time t8 to time t10, if the electronic device 100 is operated in a forward bias mode, a forward current If (smaller than 0) may flow through the electronic component 130 from the ground voltage (0V) to the node N0. The data voltage Vdata1 may be lower than the ground voltage (0V), and the data voltage Vdata1 may be higher than the second operation voltage VSS. The voltage source circuit 110 may be operated as the source follower amplifier to generates the source current I1 according to the data voltage Vdata1 provided by the DL1, so as to automatically keep the bias voltage at the node N0. The bias voltage is applied to the electronic component 130. The source current I1 flows from the voltage source circuit 110 to the node N0. The bias voltage may be lower than the ground voltage (0V). The current source circuit 120 may generate the sink current I2 according to the data voltage Vdata2. The sink current I2 flows from the node N0 to the current source circuit 120. The sink current I2 is larger than the source current IL. The sink current I2 is larger than or equal to the forward current If. In the embodiment of the disclosure, when the source current I1 is equal to the sink current I2 minus the forward current If, the bias voltage is stable.

Figure 2B:
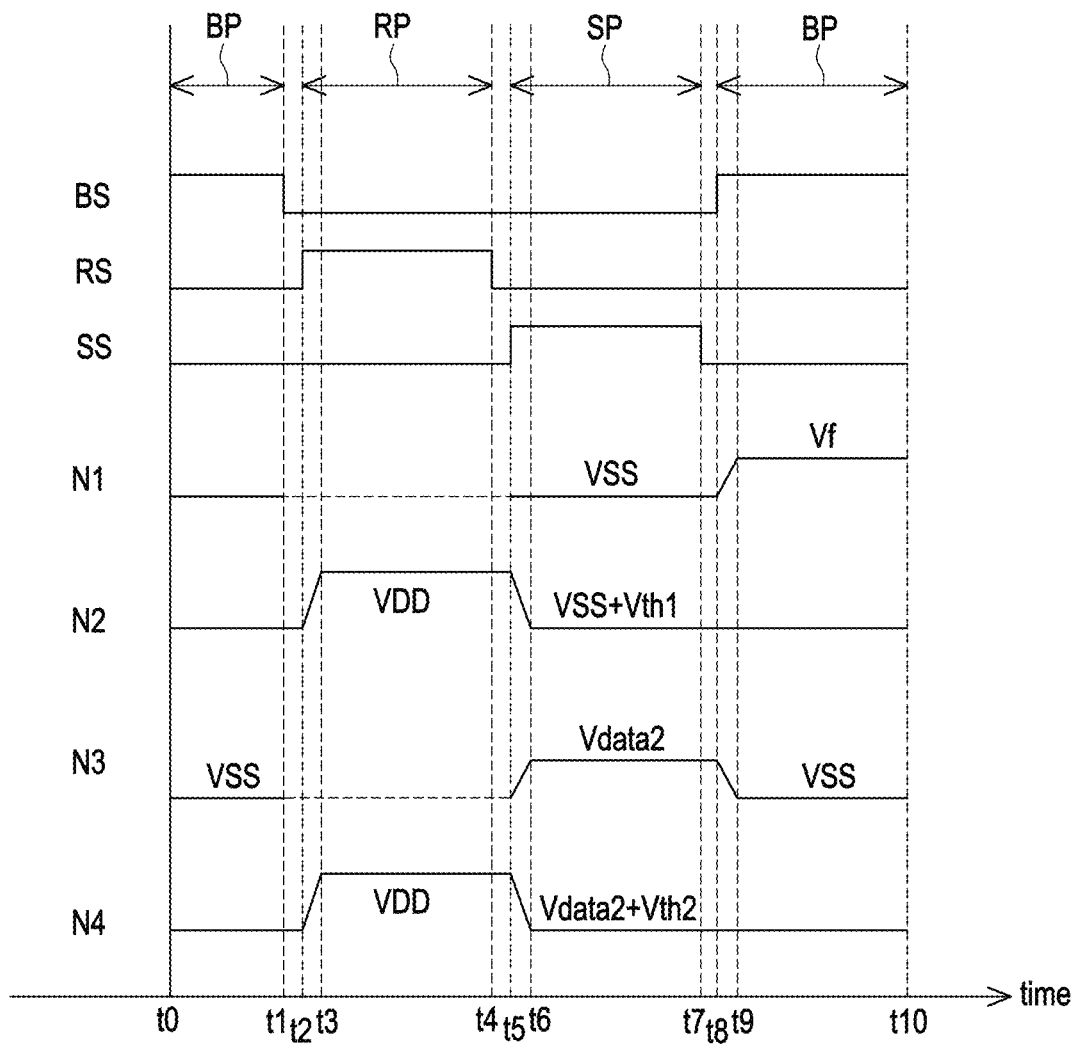
FIG. 2B is another timing diagram of related voltages and signals according to the embodiment of FIG. 1 of the disclosure.

FIG. 2B is another timing diagram of related voltages and signals according to the embodiment of FIG. 1 of the disclosure. Referring to FIG. 1 and FIG. 2B, the electronic device 100 may be operated at a bias period BP, a reset period RP and a scan period SP. In the embodiment of the disclosure, during the scan period SP from time t5 to time t7, the data line DL1 may provide a data signal with a data voltage Vdata1 to the voltage source circuit 110, and the data line DL2 may provide a data signal with a data voltage Vdata2 to the current source circuit 120. In the embodiment of the disclosure, an external control device may control the voltage source circuit 110 and the current source circuit 120 to operate the electronic component 130 by adjusting the data voltage Vdata1 and the data voltage Vdata2. In the embodiment of the disclosure, the data voltage Vdata1 may equal to the second operation voltage VSS.

During the reset period RP from time t2 to time t4, the reset signal RS may be at a high voltage level, and the bias signal BS and the scan signal SS may be at a low voltage level. Thus, the reset transistor Tr1 is turned-on, and the node N2 is charged with the first operation voltage VDD. During the period from time t2 to time t3, the voltage of node N2 rises to the first operation voltage VDD, and the drive transistor Td1 is turned-on fully from time t3 to time t4. The reset transistor Tr2 is turned-on, and the node N4 is charged with the first operation voltage VDD. During the period from time t2 to time t3, the voltage of node N4 rises to the first operation voltage VDD, and the drive transistor Td2 is turned-on fully from time t3 to time t4. Other transistors of the voltage source circuit 110 and the current source circuit 120 are turned-off.

During the scan period SP from time t5 to time t7, the scan signal SS may be at the high voltage level, and the bias signal BS and the reset signal RS may be at the low voltage level. Thus, the scan transistor Ts1 and the compensation transistor Tc1 are turned-on, and the node N2 is discharged with the data voltage Vdata1 through the compensation transistor Tc1, the drive transistor Td1 and the scan transistor Ts1 respectively, and then the data voltage Vdata1 with threshold voltage compensation (threshold voltage of the drive transistor Td1) is stored in the node N2 by the diode connection of the drive transistor Td1. In this regard, during the period from time t5 to time t6, the voltage of the node N1 may equal to the second operation voltage VSS, because the data voltage Vdata1 may equal to the second operation voltage VSS. The voltage of the node N2 may fall from the first operation voltage VDD to the voltage which equal to the second operation voltage VSS plus the threshold voltage Vth1 of the drive transistor Td1. The scan transistor Ts2 and the compensation transistor Tc2 are turned-on, and the node N4 is discharged with the data voltage Vdata2 through the compensation transistor Tc2, the drive transistor Td2 and the scan transistor Ts2 respectively, and then the data voltage Vdata2 with threshold voltage compensation (threshold voltage of the drive transistor Td2) is stored in the node N4 by the diode connection of the drive transistor Td2. In this regard, during the period from time t5 to time t6, the voltage of the node N3 rises to the data voltage Vdata2, and the voltage of the node N4 may fall from the first operation voltage VDD to the voltage which is equal to the data voltage Vdata2 plus the threshold voltage Vth2 of the drive transistor Td2. Other transistors of the voltage source circuit 110 and the current source circuit 120 are turned-off.

During the bias period BP from time t8 to time t10 (the period from time t0 to time t1 same as the period from time t9 to time t10), the bias signal BS may be at the high voltage level, and the scan signal SS and the reset signal RS may be at the low voltage level. Thus, the bias transistor Tb1, the bias transistor Tb2 and the bias transistor Tb3 are turned-on. The voltage of node N2 may be maintained at the voltage of the second operation voltage VSS plus the threshold voltage Vth1 of the drive transistor Td1. Thus, the drive transistor Td1 is turned-off, and the voltage of the node N1 may be a forward voltage Vf provided by the electronic component 130. The voltage of node N4 may be maintained at the voltage which is equal to the data voltage Vdata2 plus the threshold voltage Vth2 of the drive transistor Td2. Due to the bias transistor Tb3 is turned-on, the voltage of the node N3 may fall to the second operation voltage VSS.

In the embodiment of the disclosure, during the bias period BP from time t8 to time t10, the electronic device 100 is operated in a forward current test mode. The drive transistor Td1 is turned-off, so the source current I1 is zero, and the current source circuit 120 may generate a sink current I2 to applied to the electronic component 130 according to the data voltage Vdata2. The sink current I2 flows from the node N0 to the current source circuit 120. A forward current If may flow through the electronic component 130 from the ground voltage (0V) to the node N0. In other words, the sink current I2 flows from the electronic component 130 to the node N0. Therefore, the electronic component 130 applied by the forward current If may perform the forward current test. The forward current If is expected as a stimulus for testing of the electronic component 130, and the detectable change of the electronic component 130 (eg. emitting light, thermal change, physical deformation or others) induced by the forward current If is inspected by external instruments to judge the electronic component 130 work correctly or not.

It should be noticed that the data voltage Vdata1 and the data voltage Vdata2 should be different when the electronic device 100 is operated in the reverse bias mode, the forward bias mode or the forward current test mode. The external control device may control the voltage source circuit 110 and the current source circuit 120 to operate the electronic component 130 in the reverse bias mode, the forward bias mode or the forward current test mode by adjusting the data voltage Vdata1 and the data voltage Vdata2.

Figure 3:
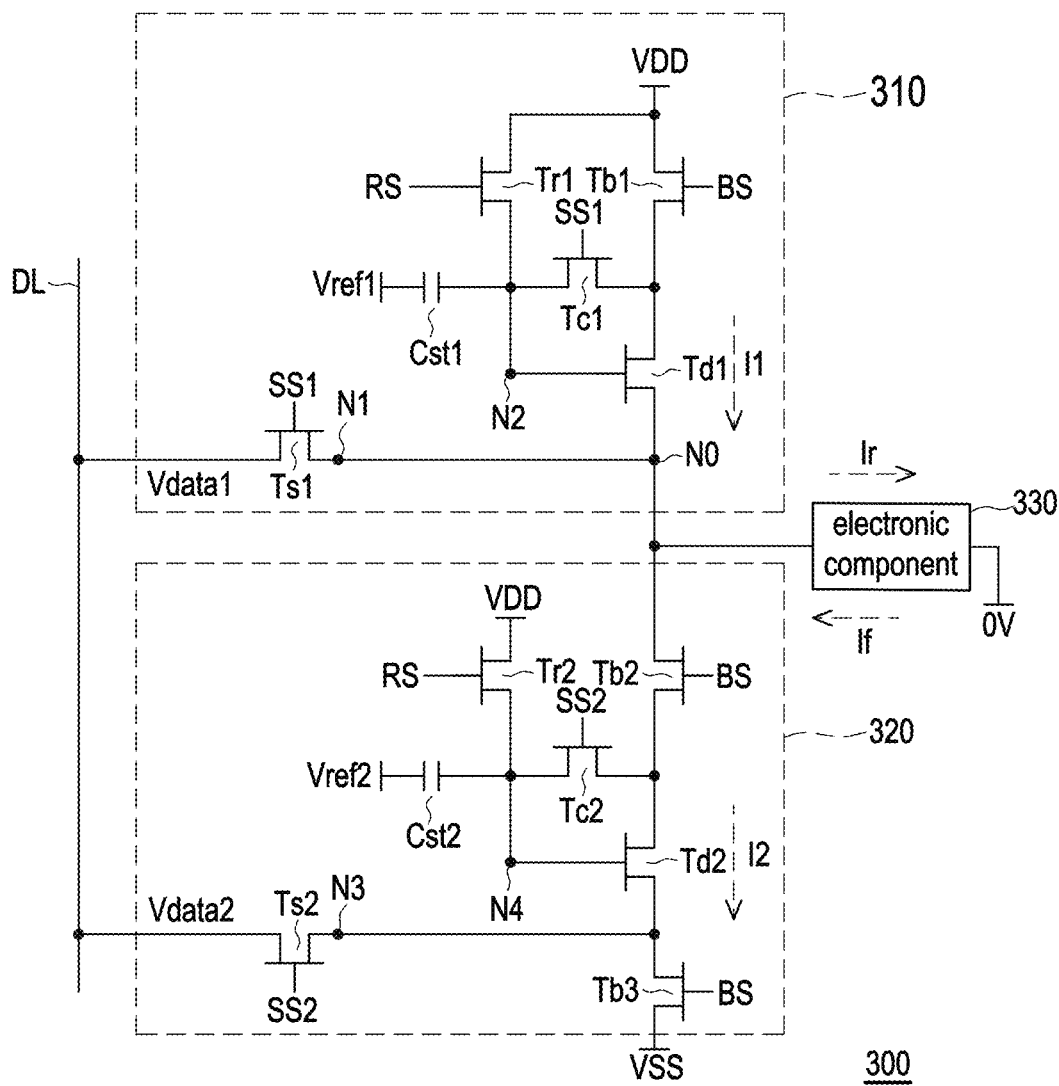
FIG. 3 is a schematic diagram of an electronic device according to an embodiment of the disclosure.

FIG. 3 is a schematic diagram of an electronic device according to an embodiment of the disclosure. Referring to FIG. 3, an electronic device 300 includes a voltage source circuit 310, a current source circuit 320 and an electronic component 330. The voltage source circuit 310, the current source circuit 320 and the electronic component 330 are electrically connected to a node N0. The voltage source circuit 310 is further electrically connected to a data line DL. The current source circuit 320 is further electrically connected to the data line DL. The electronic component 330 is electrically connected between the node N0 and a ground voltage (0V). In the embodiment of the disclosure, the voltage source circuit 310 and the current source circuit 320 form a bidirectional biasing circuit, and the voltage source circuit 310 and the current source circuit 320 are configured to enable forward and reverse bias for the electronic component 330.

In the embodiment of the disclosure, the voltage source circuit 310 includes a drive transistor Td1, a scan transistor Ts1, a compensation transistor Tc1, a bias transistor Tb1, a reset transistor Tr1 and a storage capacitor Cst1. A first terminal of the scan transistor Ts1 is electrically connected to the data line DL. A second terminal of the scan transistor Ts1 is electrically connected to a node N1. A control terminal of the scan transistor Ts1 receives a scan signal SS1. A first terminal of the bias transistor Tb1 is electrically connected to a first operation voltage VDD. A control terminal of the bias transistor Tb1 receives a bias signal BS. A first terminal of the drive transistor Td1 is electrically connected to a second terminal of the bias transistor Tb1. A second terminal of the drive transistor Td1 is electrically connected to the second terminal of the scan transistor Ts1 through the node N1, and the second terminal of the drive transistor Td1 is further electrically connected to the electronic component 330 through the node N0. The node N1 is electrically connected to the node N0. A control terminal of the drive transistor Td1 is electrically connected to a node N2. A first terminal of the compensation transistor Tc1 is electrically connected to the control terminal of the drive transistor Td1 through the node N2. A second terminal of the compensation transistor Tc1 is electrically connected to the first terminal of the drive transistor Td1. A control terminal of the compensation transistor Tc1 receives the scan signal SS1. A first terminal of the reset transistor Tr1 is electrically connected to the first operation voltage VDD. A second terminal of the reset transistor Tr1 is electrically connected to the first terminal of the compensation transistor Tc1 and the control terminal of the drive transistor Td1 through the node N2. A control terminal of the reset transistor Tr1 receives a reset signal RS. A first terminal of the storage capacitor Cst1 is electrically connected to the control terminal of the drive transistor Td1 through the node N2. A second terminal of the storage capacitor Cst1 is electrically connected to a reference voltage Vref1.

In the embodiment of the disclosure, the drive transistor Td1, the scan transistor Ts1, the compensation transistor Tc1, the bias transistor Tb1 and the reset transistor Tr1 are N-type transistors, such as a N-type metal oxide semiconductor (NMOS). In other embodiments of the disclosure, the drive transistor Td1 or other transistors may be a P-type transistor, such as a P-type metal oxide semiconductor (PMOS).

In the embodiment of the disclosure, the current source circuit 320 includes a drive transistor Td2, a scan transistor Ts2, a compensation transistor Tc2, a bias transistor Tb2, a bias transistor Tb3, a reset transistor Tr2 and a storage capacitor Cst2. A first terminal of the scan transistor Ts2 is electrically connected to the data line DL. A second terminal of the scan transistor Ts2 is electrically connected to a node N3. A control terminal of the scan transistor Ts2 receives a scan signal SS2. A first terminal of the bias transistor Tb2 is electrically connected to the electronic component 330 through the node N0. A control terminal of the bias transistor Tb2 receives the bias signal BS. A first terminal of the drive transistor Td2 is electrically connected to a second terminal of the bias transistor Tb2. A second terminal of the drive transistor Td2 is electrically connected to the second terminal of the scan transistor Ts2 through the node N3. A control terminal of the drive transistor Td2 is electrically connected to a node N4. A first terminal of the compensation transistor Tc2 is electrically connected to the control terminal of the drive transistor Td2 through the node N4. A second terminal of the compensation transistor Tc2 is electrically connected to the first terminal of the drive transistor Td2. A control terminal of the compensation transistor Tc2 receives the scan signal SS2. A first terminal of the reset transistor Tr2 is electrically connected to the first operation voltage VDD. A second terminal of the reset transistor Tr2 is electrically connected to the first terminal of the compensation transistor Tc2 and the control terminal of the drive transistor Td2 through the node N4. A control terminal of the reset transistor Tr2 receives the reset signal RS. A first terminal of the storage capacitor Cst2 is electrically connected to the control terminal of the drive transistor Td2 through the node N4. A second terminal of the storage capacitor Cst2 is electrically connected to a reference voltage Vref2. A first terminal of the bias transistor Tb3 is electrically connected to the second terminal of the drive transistor Td2 and the second terminal of the scan transistor Ts2. A second terminal of the bias transistor Tb3 is electrically connected to a second operation voltage VSS. A control terminal of the bias transistor Tb3 is electrically connected to the bias signal BS. The first operation voltage VDD may be higher than the second operation voltage VSS, and the second operation voltage VSS may be lower than the ground voltage (0V). In the embodiment of the disclosure, the electronic component 330 may receive a third operation voltage through the node N0, and the third operation voltage is between the first operation voltage VDD and the second operation voltage VSS.

In the embodiment of the disclosure, the drive transistor Td2, the scan transistor Ts2, the compensation transistor Tc2, the bias transistor Tb2, the bias transistor Tb3 and the reset transistor Tr2 are N-type transistors. In other embodiments of the disclosure, the drive transistor Td2 or other transistors may be a P-type transistor.

In the embodiment of the disclosure, the voltage source circuit 310 and the current source circuit 320 receive different scan signals.

Figure 4:
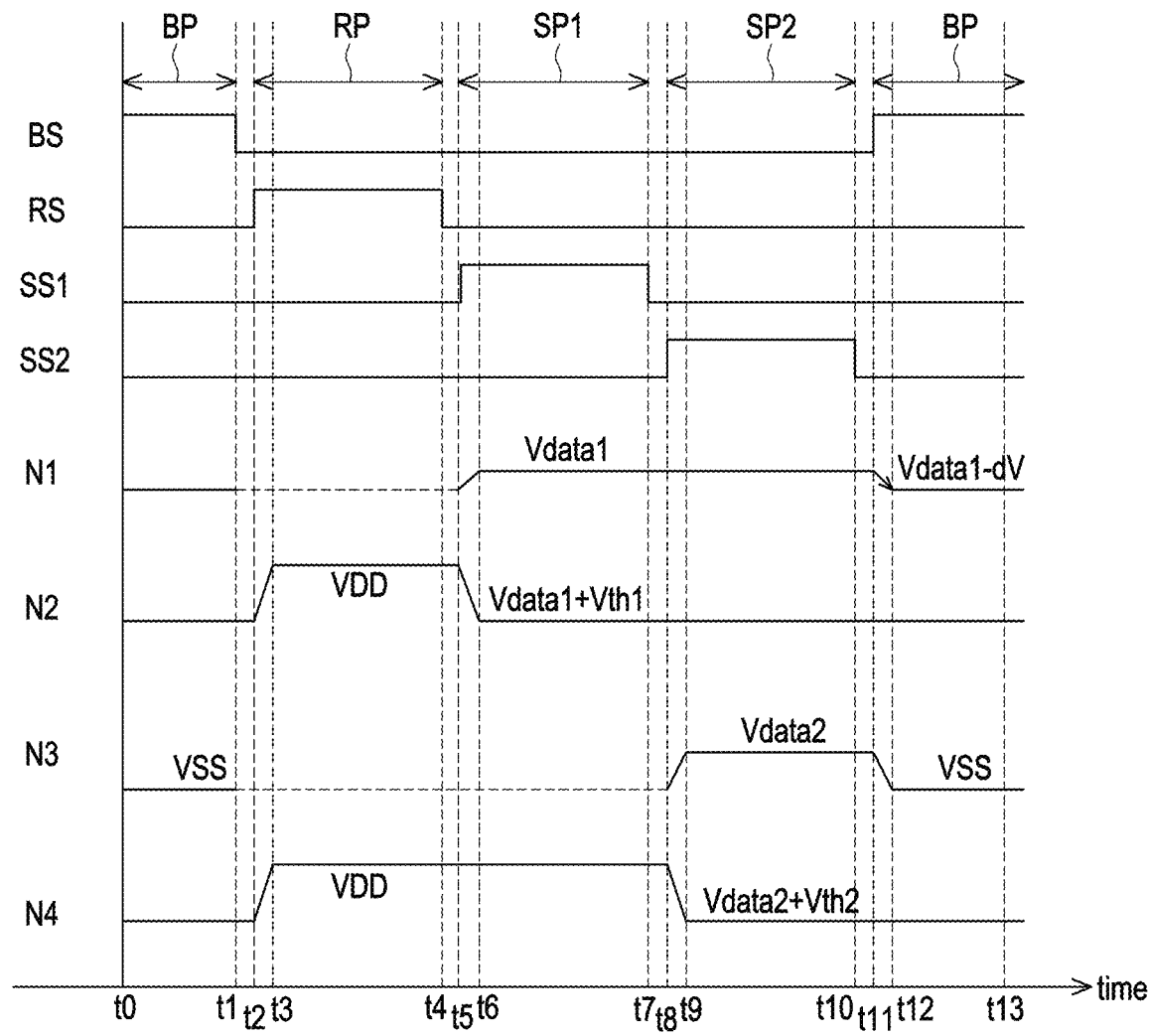
FIG. 4 is a timing diagram of related voltages and signals according to the embodiment of FIG. 3 of the disclosure.

FIG. 4 is a timing diagram of related voltages and signals according to the embodiment of FIG. 3 of the disclosure. Referring to FIG. 3 and FIG. 4, the electronic device 300 may be operated at a bias period BP, a reset period RP, a first scan period SP1 and a second scan period SP2. In the embodiment of the disclosure, during the scan period SP1 from time t5 to time t7, the data line DL may provide a data signal with a data voltage Vdata1 to the voltage source circuit 310. During the scan period SP2 from time t8 to time t10, the data line DL may provide the data signal with a data voltage Vdata2 to the current source circuit 320. In the embodiment of the disclosure, an external control device may control the voltage source circuit 310 and the current source circuit 320 to operate the electronic component 330 by adjusting the data voltage Vdata1 and the data voltage Vdata2.

During the reset period RP from time t2 to time t4, the reset signal RS may be at a high voltage level, and the bias signal BS, the scan signal SS1 and the scan signal SS2 may be at a low voltage level. Thus, the reset transistor Tr1 is turned-on, and the node N2 is charged with the first operation voltage VDD. During the period from time t2 to time t3, the voltage of node N2 rises to the first operation voltage VDD, and the drive transistor Td1 is turned-on fully from time t3 to time t4. The reset transistor Tr2 is turned-on, and the node N4 is charged with the first operation voltage VDD. During the period from time t2 to time t3, the voltage of node N4 rises to the first operation voltage VDD, and the drive transistor Td2 is turned-on fully from time t3 to time t4. Other transistors of the voltage source circuit 310 and the current source circuit 320 are turned-off.

During the first scan period SP1 from time t5 to time t7, the scan signal SS1 may be at the high voltage level, and the bias signal BS, the reset signal RS and the scan signal SS2 may be at the low voltage level. Thus, the scan transistor Ts1 and the compensation transistor Tc1 are turned-on, and the node N2 is discharged with the data voltage Vdata1 through the compensation transistor Tc1, the drive transistor Td1 and the scan transistor Ts1 respectively, and then the data voltage Vdata1 with threshold voltage compensation (threshold voltage of the drive transistor Td1) is stored in the node N2 by the diode connection of the drive transistor Td1. The drive transistor Td2 is turned-on, and other transistors of the current source circuit 320 are turned-off, and other transistors of the voltage source circuit 310 are turned-off. In this regard, during the period from time t5 to time t6, the voltage of the node N1 rises to the data voltage Vdata1, and the voltage of the node N2 may fall from the first operation voltage VDD to the voltage which equal to the data voltage Vdata1 plus the threshold voltage Vth1 of the drive transistor Td1.

During the second scan period SP2 from time t8 to time t10, the scan signal SS2 may be at the high voltage level, and the bias signal BS, the reset signal RS and the scan signal SS1 may be at the low voltage level. Thus, the scan transistor Ts2 and the compensation transistor Tc2 are turned-on, and the node N4 is discharged with the data voltage Vdata2 through the compensation transistor Tc2, the drive transistor Td2 and the scan transistor Ts2 respectively, and then the data voltage Vdata2 with threshold voltage compensation (threshold voltage of the drive transistor Td2) is stored in the node N4 by the diode connection of the drive transistor Td2. All transistors of the voltage source circuit 310 are turned-off, and other transistors of the current source circuit 320 are turned-off. In this regard, during the period from time t8 to time t9, the voltage of the node N3 rises to the data voltage Vdata2, and the voltage of the node N4 may fall from the first operation voltage VDD to the voltage which is equal to the data voltage Vdata2 plus the threshold voltage Vth2 of the drive transistor Td2.

During the bias period BP from time t11 to time t13 (the period from time t0 to time t1 same as the period from time t12 to time t13), the bias signal BS may be at the high voltage level, the scan signal SS1, the scan signal SS2 and the reset signal RS may be at the low voltage level. Thus, the bias transistor Tb1, the bias transistor Tb2 and the bias transistor Tb3 are turned-on. The voltage of node N2 may be maintained at the voltage which is equal to the data voltage Vdata1 plus the threshold voltage Vth1 of the drive transistor Td1. Thus, the voltage of the node N1 may be the voltage which is equal to the data voltage Vdata1 minus a delta voltage dV. The voltage of node N4 may be maintained at the voltage which is equal to the data voltage Vdata2 plus the threshold voltage Vth2 of the drive transistor Td2. Due to the bias transistor Tb3 is turned-on, the voltage of the node N3 may fall to the second operation voltage VSS.

During the bias period BP from time t11 to time t13, if the electronic device 300 is operated in a reverse bias mode, a reverse current Jr may flow through the electronic component 330 from the node N0 to the ground voltage (0V). The data voltage Vdata1 may be lower than the first operation voltage VDD, and the data voltage Vdata1 may be higher than or equal to the ground voltage (0V). The voltage source circuit 310 may be operated as a source follower amplifier to generate a source current I1 according to the data voltage Vdata1 provided by the data line DL, so as to automatically keep a bias voltage at the node N0. The bias voltage is applied to the electronic component 330. The source current I1 flows from the voltage source circuit 310 to the node N0. The bias voltage may be higher than the ground voltage (0V). If the reverse current Ir is too small to be compensated by the source current I1, the current source circuit 320 may generate a sink current I2 according to the data voltage Vdata2. The sink current I2 flows from the node N0 to the current source circuit 320. The source current I1 is larger than the sink current I2. If the reverse current Ir is large enough, the sink current I2 may be zero with the drive transistor Td2 turned-off by the data voltage Vdata2. In the embodiment of the disclosure, when the source current I1 is equal to the sink current I2 plus the reverse current Ir, the bias voltage is stable. In other words, the reverse current Ir may equal to the source current I1 minus the sink current I2.

During the bias period BP from time t11 to time t13, if the electronic device 300 is operated in a forward bias mode, a forward current If may flow through the electronic component 330 from the ground voltage (0V) to the node N0. The data voltage Vdata1 may be lower than the ground voltage (0V), and the data voltage Vdata1 may be higher than the second operation voltage VSS. The voltage source circuit 310 may be operated as the source follower amplifier to generate the source current I1 according to the data voltage Vdata1 provided by the data line DL, so as to automatically keep the bias voltage at the node N0. The bias voltage is applied to the electronic component 330. The source current I1 flows from the voltage source circuit 310 to the node N0. The bias voltage may be lower than the ground voltage (0V). The current source circuit 320 may generate the sink current I2 according to the data voltage Vdata2. The sink current I2 flows from the node N0 to the current source circuit 320. The sink current I2 is larger than the source current I1. The sink current I2 is larger than or equal to the forward current If. In the embodiment of the disclosure, when the source current I1 is equal to the sink current I2 minus the forward current If, the bias voltage is stable.

Figure 5:
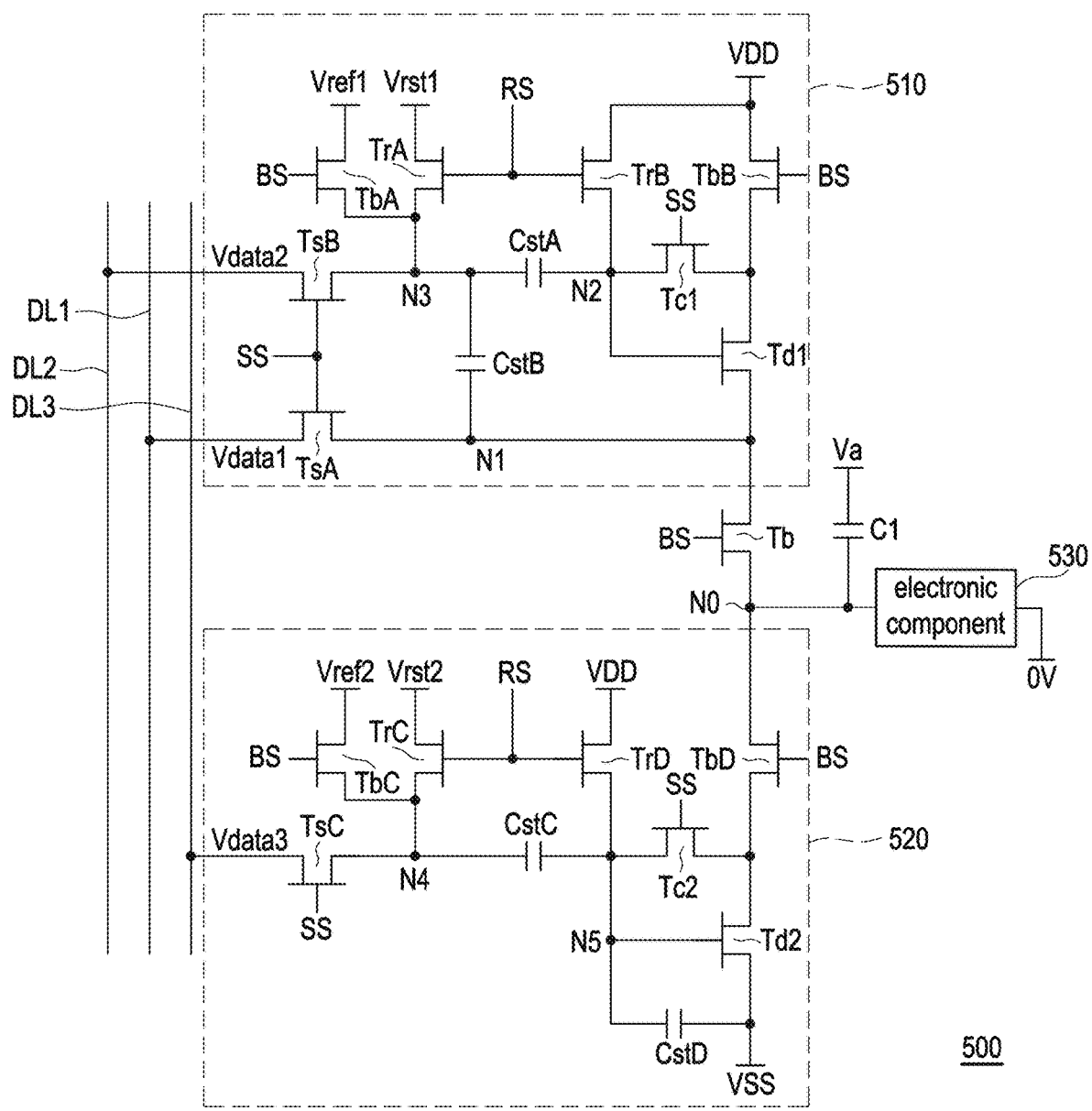
FIG. 5 is a schematic diagram of an electronic device according to an embodiment of the disclosure.

FIG. 5 is a schematic diagram of an electronic device according to an embodiment of the disclosure. Referring to FIG. 5, an electronic device 500 includes a voltage source circuit 510, a current source circuit 520, an electronic component 530, a bias transistor Tb and a capacitor C1. The voltage source circuit 510 is electrically connected to a node N0 through the bias transistor Tb. The current source circuit 520, the electronic component 530 and the capacitor C1 are electrically connected to the node N0. A first terminal of the capacitor C1 is electrically connected to a reference voltage Va. A second terminal of the capacitor C1 is electrically connected to the node N0. The voltage source circuit 510 is further electrically connected to a data line DL1 and a data line DL2. The current source circuit 520 is further electrically connected to a data line DL3. The electronic component 530 is electrically connected between the node N0 and a ground voltage (0V). In the embodiment of the disclosure, the voltage source circuit 510 and the current source circuit 520 form a bidirectional biasing circuit, and the voltage source circuit 510 and the current source circuit 520 are configured to enable forward and reverse bias for the electronic component 530. In the embodiment of the disclosure, the voltage source circuit 510, the current source circuit 520 and the electronic component 530 may be a pixel unit of an array in a panel, and other pixel unit of the array may also have same circuit as the electronic device 500.

In the embodiment of the disclosure, the voltage source circuit 510 includes a drive transistor Td1, a scan transistor TsA, a scan transistor TsB, a compensation transistor Tc1, a bias transistor TbA, a bias transistor TbB, a reset transistor TrA, a reset transistor TrB, a storage capacitor CstA and a storage capacitor CstB. A first terminal of the scan transistor TsA is electrically connected to the data line DL1. A second terminal of the scan transistor TsA is electrically connected to a node N1. A control terminal of the scan transistor TsA receives a scan signal SS. A first terminal of the scan transistor TsB is electrically connected to the data line DL2. A second terminal of the scan transistor TsB is electrically connected to a node N3. A control terminal of the scan transistor TsB receives the scan signal SS. A first terminal of the bias transistor TbA is electrically connected to a reference voltage Vref1. A control terminal of the bias transistor TbA receives a bias signal BS. A second terminal of the bias transistor TbA is electrically connected to the node N3. A first terminal of the bias transistor TbB is electrically connected to a first operation voltage VDD. A control terminal of the bias transistor TbB receives the bias signal BS. A first terminal of the drive transistor Td1 is electrically connected to a second terminal of the bias transistor TbB. A second terminal of the drive transistor Td1 is electrically connected to the second terminal of the scan transistor TsA through the node N1, and the second terminal of the drive transistor Td1 is further electrically connected to a first terminal of the bias transistor Tb. A control terminal of the drive transistor Td1 is electrically connected to a node N2. A first terminal of the compensation transistor Tc1 is electrically connected to the control terminal of the drive transistor Td1 through the node N2. A second terminal of the compensation transistor Tc1 is electrically connected to the first terminal of the drive transistor Td1. A control terminal of the compensation transistor Tc1 receives the scan signal SS. A first terminal of the reset transistor TrA is electrically connected to the first reset voltage Vrst1. A second terminal of the reset transistor TrA is electrically connected to the node N3. A control terminal of the reset transistor TrA receives a reset signal RS. A first terminal of the reset transistor TrB is electrically connected to the first operation voltage VDD. A second terminal of the reset transistor TrB is electrically connected to the first terminal of the compensation transistor Tc1 and the control terminal of the drive transistor Td1 through the node N2. A control terminal of the reset transistor TrB receives the reset signal RS. A first terminal of the storage capacitor CstA is electrically connected to the control terminal of the drive transistor Td1 through the node N2. A second terminal of the storage capacitor CstA is electrically connected to the node N3. A first terminal of the storage capacitor CstB is electrically connected to the node N3. A second terminal of the storage capacitor CstB is electrically connected to the node N1.

In the embodiment of the disclosure, the drive transistor Td1, the scan transistor TsA, the scan transistor TsB, the compensation transistor Tc1, the bias transistor TbA, the bias transistor TbB, the reset transistor TrA, and the reset transistor TrB are N-type transistors, such as the NMOS. In other embodiments of the disclosure, the drive transistor Td1 or other transistors may be a P-type transistor, such as the PMOS.

In the embodiment of the disclosure, the current source circuit 520 includes a drive transistor Td2, a scan transistor TsC, a compensation transistor Tc2, a bias transistor TbC, a bias transistor TbD, a reset transistor TrC, a reset transistor TrD, a storage capacitor CstC and a storage capacitor CstD. A first terminal of the scan transistor TsC is electrically connected to the data line DL3. A second terminal of the scan transistor TsC is electrically connected to a node N4. A control terminal of the scan transistor TsC receives the scan signal SS. A first terminal of the bias transistor TbC is electrically connected to a reference voltage Vref2. A control terminal of the bias transistor TbC receives the bias signal BS. A second terminal of the bias transistor TbC is electrically connected to the node N4. A first terminal of the bias transistor TbD is electrically connected to the node N0. A control terminal of the bias transistor TbD receives the bias signal BS. A first terminal of the drive transistor Td2 is electrically connected to a second terminal of the bias transistor TbD. A second terminal of the drive transistor Td2 is electrically connected to a second operation voltage VSS. A control terminal of the drive transistor Td2 is electrically connected to a node N5. A first terminal of the compensation transistor Tc2 is electrically connected to the control terminal of the drive transistor Td2 through the node N5. A second terminal of the compensation transistor Tc2 is electrically connected to the first terminal of the drive transistor Td2. A control terminal of the compensation transistor Tc2 receives the scan signal SS. A first terminal of the reset transistor TrC is electrically connected to a second reset voltage Vrst2. A second terminal of the reset transistor TrC is electrically connected to the node N4. A control terminal of the reset transistor TrC receives the reset signal RS. A first terminal of the reset transistor TrD is electrically connected to the first operation voltage VDD. A second terminal of the reset transistor TrD is electrically connected to the first terminal of the compensation transistor Tc2 and the control terminal of the drive transistor Td2 through the node N5. A control terminal of the reset transistor TrD receives the reset signal RS. A first terminal of the storage capacitor CstC is electrically connected to the control terminal of the drive transistor Td2 through the node N5. A second terminal of the storage capacitor CstC is electrically connected to the node N4. A first terminal of the storage capacitor CstD is electrically connected to the node N5. A second terminal of the storage capacitor CstD is electrically connected to the second operation voltage VSS. In the embodiment of the disclosure, the electronic component 530 may receive a third operation voltage through the node N0, and the third operation voltage is between the first operation voltage VDD and the second operation voltage VSS.

In the embodiment of the disclosure, the drive transistor Td2, the scan transistor TsC, the compensation transistor Tc2, the bias transistor TbC, the bias transistor TbD, the reset transistor TrC, and the reset transistor TrD are N-type transistors, such as the NMOS. In other embodiments of the disclosure, the drive transistor Td2 or other transistors may be a P-type transistor, such as the PMOS.

In the embodiment of the disclosure, the voltage source circuit 510 and the current source circuit 520 receive same scan signal SS.

Figure 6:
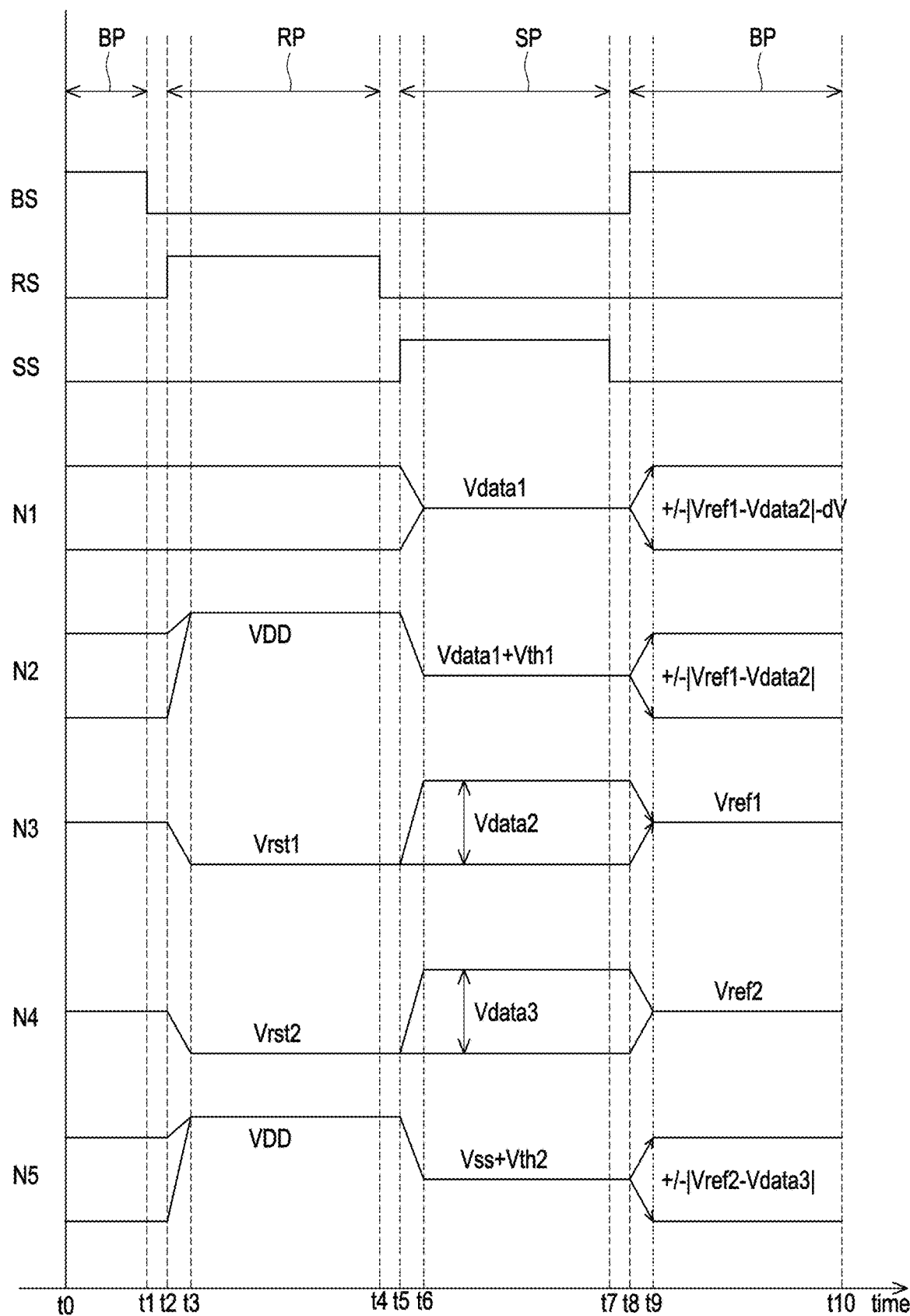
FIG. 6 is a timing diagram of related voltages and signals according to the embodiment of FIG. 5 of the disclosure.

FIG. 6 is a timing diagram of related voltages and signals according to the embodiment of FIG. 5 of the disclosure. Referring to FIG. 5 and FIG. 6, the electronic device 500 may be operated at a bias period BP, a reset period RP and a scan period SP. In the embodiment of the disclosure, during the scan period SP from time t5 to time t7, the data line DL1 may provide a data signal with a data voltage Vdata1 to the voltage source circuit 510, and the data line DL2 May provide a data signal with a data voltage Vdata2 to the voltage source circuit 510. The data line DL3 may provide a data signal with a data voltage Vdata3 to the current source circuit 520. In the embodiment of the disclosure, an external control device may control the voltage source circuit 510 and the current source circuit 520 to operate the electronic component 530 by adjusting the data voltage Vdata1, the data voltage Vdata2 and the data voltage Vdata3. It should be noticed that the data voltage Vdata1, the data voltage Vdata2 and the data voltage Vdata3 are positive voltages in the embodiment.

During the reset period RP from time t2 to time t4, the reset signal RS may be at a high voltage level, and the bias signal BS and the scan signal SS may be at a low voltage level. Thus, the reset transistor TrA and the reset transistor TrB are turned-on. The node N2 is charged with the first operation voltage VDD. The storage capacitor CstA is charged with the first operation voltage VDD. During the period from time t2 to time t3, the voltage of node N2 rises to the first operation voltage VDD, and the drive transistor Td1 is turned-on fully from time t3 to time t4. The voltage of node N3 falls to the first reset voltage Vrst1. The reset transistor TrC and the reset transistor TrD are turned-on, and the node N5 is charged with the first operation voltage VDD. The storage capacitor CstC is charged with the first operation voltage VDD. During the period from time t2 to time t3, the voltage of node N5 rises to the first operation voltage VDD, and the drive transistor Td2 is turned-on fully from time t3 to time t4. The voltage of node N4 falls to the second reset voltage Vrst2. Other transistors of the voltage source circuit 510 and the current source circuit 520 are turned-off.

During the scan period SP from time t5 to time t7, the scan signal SS may be at the high voltage level, and the bias signal BS and the reset signal RS may be at the low voltage level. Thus, the scan transistor TsA, the scan transistor TsB and the compensation transistor Tc1 are turned-on, and the node N2 is discharged with the data voltage Vdata1 through the compensation transistor Tc1, the drive transistor Td1 and the scan transistor TsA respectively, and then the data voltage Vdata1 with threshold voltage compensation (threshold voltage of the drive transistor Td1) is stored in the node N2 by the diode connection of the drive transistor Td1. In this regard, during the period from time t5 to time t6, the voltage of the node N1 changes to the data voltage Vdata1, and the voltage of the node N2 may fall from the first operation voltage VDD to the voltage which equal to the data voltage Vdata1 plus the threshold voltage Vth1 of the drive transistor Td1. The voltage of the node N3 changes to the data voltage Vdata2. The scan transistor TsC, the scan transistor TsD and the compensation transistor Tc2 are turned-on, and the node N4 changes to the data voltage Vdata3, and then the second operation voltage VSS with threshold voltage compensation (threshold voltage of the drive transistor Td2) is stored in the node N5 by the diode connection of the drive transistor Td2. In this regard, during the period from time t5 to time t6, the voltage of the node N5 may fall from the first operation voltage VDD to the voltage which is equal to the second operation voltage VSS plus the threshold voltage Vth2 of the drive transistor Td2. Other transistors of the voltage source circuit 510 and the current source circuit 520 are turned-off.

During the bias period BP from time t8 to time t10 (the period from time t0 to time t1 same as the period from time t9 to time t10), the bias signal BS may be at the high voltage level, and the scan signal SS and the reset signal RS may be at the low voltage level. Thus, the bias transistor Tb, the bias transistor TbA, the bias transistor TbB, the bias transistor TbC and the bias transistor TbD are turned-on. The voltage of node N2 may be changed from the data voltage Vdata1 plus the threshold voltage Vth1 of the drive transistor Td1 by the voltage which is equal to the positive or negative absolute value of the first reference voltage Vref1 minus the data voltage Vdata2. Thus, the voltage of the node N1 may be the voltage which is equal to may be changed from the data voltage Vdata1 by the voltage which is equal to the positive or negative absolute value of the first reference voltage Vres1 minus the data voltage Vdata2, and minus the delta voltage dV. The voltage of node N3 may change to the voltage which is equal to the first reference voltage Vref1. The voltage of node N4 may change to the voltage which is equal to the second reference voltage Vref2. The voltage of the node N5 may change from the second operation voltage VSS plus the threshold voltage Vth2 of the drive transistor Td2 by the voltage which is equal to the positive or negative absolute value of the second reference voltage Vref2 minus the data voltage Vdata3. Therefore, the node N0 may have a bias voltage, and the bias voltage may equal to the data voltage Vdata1 plus the first reference voltage Vref1, minus the data voltage Vdata2 and minus the delta voltage dV. Thus, the voltage source circuit 510 and the current source circuit 520 may receive the plurality of positive data voltages to generate the negative voltage bias for the electronic component 530.

In addition, the electronic device 500 may also be operated in a reverse bias mode, a forward bias mode and forward current test mode as the above embodiments of FIG. 1 to FIG. 4, so the details are not repeated here.

In summary, the electronic device of the disclosure can realize a bidirectional biasing circuit including a voltage source circuit and a current source circuit, and the voltage source circuit and the current source circuit have threshold voltage compensation effect respectively. Therefore, the electronic device of the disclosure can effectively operate the electronic component at the reverse bias mode or the forward bias mode.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
a first circuit;
a second circuit; and
an electronic component,
wherein the first circuit, the second circuit, and the electronic component are electrically connected to a node,
wherein the first circuit receives a first operation voltage, and the second circuit receives a second operation voltage,
wherein the electronic component receives a third operation voltage, and the third operation voltage is between the first operation voltage and the second operation voltage.

2. The electronic device according to claim 1, wherein a first current flows from the first circuit to the node, and a second current flows from the node to the second circuit.

3. The electronic device according to claim 2, wherein a third current is equal to the first current minus the second current, and the third current flows from the node to the electronic component.

4. The electronic device according to claim 3, wherein the third current is a reverse current when the third current is greater than 0.

5. The electronic device according to claim 3, wherein the third current is a forward current when the third current is smaller than 0.

6. The electronic device according to claim 5, wherein the first current is equal to 0 and used for a forward current test of the electronic component.

7. The electronic device according to claim 1, wherein the first circuit comprises a first scan transistor, and the second circuit comprises a second scan transistor.

8. The electronic device according to claim 7, further comprising:
a first data line; and
a second data line,
wherein the first circuit is electrically connected to the first data line, and the second circuit is electrically connected to the second data line,
wherein the first circuit and the second circuit receive same scan signal.

9. The electronic device according to claim 8, wherein the first scan transistor is electrically connected to the first data line, and the second scan transistor is electrically connected to the second data line, wherein the first scan transistor and the second scan transistor receive the same scan signal.

10. The electronic device according to claim 7, further comprising:

a data line,
wherein the first circuit and the second circuit are electrically connected to the data line, and the first circuit and the second circuit receive different scan signals.

11. The electronic device according to claim 10, wherein the first scan transistor and the second scan transistor are electrically connected to the data line, and the first scan transistor and the second scan transistor receive the different scan signal.

12. The electronic device according to claim 7, wherein the first circuit further comprises a first drive transistor, and the second circuit further comprises a second drive transistor.

13. The electronic device according to claim 12, wherein the first circuit further comprises a first compensation transistor, a first reset transistor and a first bias transistor, and the first compensation transistor and the first scan transistor receive same scan signal.

14. The electronic device according to claim 12, wherein the second circuit further comprises a second compensation transistor, a second reset transistor, a second bias transistor and a third bias transistor, and the second compensation transistor and the second scan transistor receive same scan signal.

15. The electronic device according to claim 12, wherein the first circuit further comprises a first storage capacitor, and the second circuit further comprises a second storage capacitor.

16. The electronic device according to claim 7, wherein the first circuit further comprises a third transistor.

17. The electronic device according to claim 16, further comprising:
a third data line,
wherein the first circuit is electrically connected to the third data line, and the third transistor and the first scan transistor receive same scan signal.

18. The electronic device according to claim 16, further comprising:
a bias transistor, electrically connected between the first circuit and the node.

19. The electronic device according to claim 16, wherein the first circuit comprises a third capacitor, a third reset transistor and a fourth bias transistor, and the second circuit comprises a fourth capacitor, a fourth reset transistor and a fifth bias transistor.

* * * * *